United States Patent [19]
Kato

[11] Patent Number: 4,566,762
[45] Date of Patent: Jan. 28, 1986

[54] DUAL FOCUS OPTICAL SYSTEM
[75] Inventor: Kinya Kato, Kawasaki, Japan
[73] Assignee: Nippon Kogaku K. K., Tokyo, Japan
[21] Appl. No.: 527,388
[22] Filed: Aug. 29, 1983
[30] Foreign Application Priority Data
  Sep. 2, 1982 [JP] Japan .................. 57-153070
[51] Int. Cl.$^4$ .................. G02B 5/30; G02B 27/28
[52] U.S. Cl. .................. 350/411; 350/403
[58] Field of Search .................. 350/411, 403
[56] References Cited
  U.S. PATENT DOCUMENTS
  3,432,238  3/1969  Girard .................. 350/411 X
  3,990,798  1/1976  White .................. 356/411

Primary Examiner—John K. Corbin
Assistant Examiner—Scott J. Sugarman
Attorney, Agent, or Firm—Shapiro and Shapiro

[57] ABSTRACT

A dual focus optical system for causing the images of two objects separate from each other on the optical axis to be formed on the same image plane comprises a diverging element for causing a second light ray to diverge relative to a first light ray, a converging element provided on the object side of the diverging element for converging the second light ray relative to the first light ray, and an objective lens provided on the object side of the two elements for converging both of the first light ray and the second light ray. The objective lens is disposed so that the point of intersection between the first light ray and the second light ray in the composite system comprising the diverging element and the converging element is coincident with the focal plane of the objective lens which is adjacent to the converging element.

12 Claims, 10 Drawing Figures

DUAL FOCUS OPTICAL SYSTEM

BACKGROUND OF THE INVENTION

1. Field of the Invention

This invention relates to an optical system capable of causing the images of objects separate from each other on the optical axis to be formed on the same plane, that is, a so-called dual focus objective lens.

2. Description of the Prior Art

The use of an objective lens of this type enables two objects lying at different positions in the direction of the optical axis to be overlappingly observed in the same field of view and is very useful. However, generally, the fact that two objects lie at different positions in the direction of the optical axis means that the object distances with respect to the objective lens differ from each other and necessarily the imaging magnifications of the two objects differ from each other. Therefore, an error occurs when an attempt is made to compare the two objects from the two object images. Also, for example, in a proximity type exposure apparatus used for the manufacture of IC, where an objective lens of this type is used in an alignment system for a mask and a wafer to cause the images of alignment marks provided on the mask and wafer to be aligned in a predetermined relation to thereby accomplish alignment, if the alignment marks are positioned off the optical axis, an alignment error is liable to occur due to the difference in image magnification and this is disadvantageous for precise alignment.

In a dual focus system which uses, for example, a double refraction element to cause the images of objects lying at different positions to be formed on the same image plane by polarized lights orthogonal to each other, a construction in which the double refraction element is disposed at the rearward focus position of an objective lens to thereby equalize the magnifications of the object images is known from U.S. Pat. No. 3,990,798 (Japanese Laid-open patent application No. 112282/1976). However, a microscope objective lens generally comprises a plurality of lenses and therefore, the rearward focus thereof lies in the interior of the lens and it is difficult to accurately dispose the double refraction element at the rearward focus position of the objective lens and accordingly, actually, it has been impossible to sufficiently eliminate the magnification difference as a dual focus system.

SUMMARY OF THE INVENTION

It is therefore an object of the present invention to provide a dual focus optical system which enables the images of objects lying at different positions in the direction of the optical axis to be formed by any objective lens always without a magnification difference.

The dual focus optical system according to the present invention has a diverging element for causing a second light ray to diverge relative to a first light ray, a converging element for converging the second light ray relative to the first light ray, and an objective lens having a converging action for both of the first and the second light ray, the point of intersection between the first light ray and the second light ray by the composite system comprising the diverging element and the converging element being disposed in coincidence with the focus of the objective lens which is adjacent to the converging element, and more exactly, the focal plane of the objective lens.

The invention will become more fully apparent from the following detailed description thereof taken in conjunction with the accompanying drawings.

DESCRIPTION OF THE PREFERRED EMBODIMENTS

Figure 1:
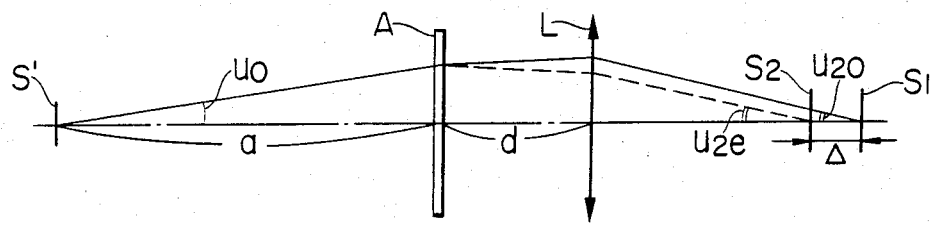
FIG. 1 illustrates the prior art.

A construction comprising a combination of a double refraction element A and an objective lens L will first be analyzed. In this construction shown in FIG. 1, the following well-known light ray pursuit formula in the paraxial area applies:

$$\begin{cases} U_i = U_{i-1} + Y_i \cdot \phi_i \\ Y_{i+1} = Y_i - d_i \cdot U_i \end{cases} (i = 1, 2, \ldots)$$

where $\phi_i$ represents the refractive power of the ith lens surface, $U_{i-1}$ and $U_i$ respectively represent the angles formed by the light ray entering the ith lens surface and the light ray emergent from the ith lens surface, respectively, with respect to the optical axis, $Y_i$ and $Y_{i+1}$ respectively represent the distance of the light ray cutting the ith lens surface and the light ray cutting the (i+1)th lens surface, respectively, from the optical axis, and $d_i$ represents the spacing between the ith lens surface and the (i+1)th lens surface. It is assumed that the image of a first object S1 is formed by ordinary light rays, the image of a second object S2 is formed by extraordinary light rays and the images S' of the two objects are coincident with each other. The refractive power of the objective lens L is $\phi_M$, the refractive power of the double refraction element A for ordinary light rays is $\phi_o$, the refractive power of the double refraction element A for extraordinary light rays is $\phi_e$, and the spacing between the objective lens L and the double refraction element A is d, and pursuit is effected from the image side by the use of the above-mentioned light ray pursuit formula to find the angles $U_{2o}$ and $U_{2e}$ formed by the respective light rays at the first object S1 and the second object S2 with respect to the optical axis. If the spacing between the image S' and the double refraction element A is a and $U_o = -1/a$ is given, $$U_{2o} = \frac{1}{a} \{a(\phi_o + \phi_M) + d\phi_M(1 - a\phi_o) - 1\}$$

$$U_{2e} = \frac{1}{a} \{a(\phi_e + \phi_M) + d\phi_M(1 - a\phi_e) - 1\}.$$

The condition for which $U_{2o} = U_{2e}$ is $d = 1/\phi_M = f_M$ ($f_M$ is the focal length of the objective lens). $U_{2o} = U_{2e}$ means that the imaging magnifications by ordinary light rays and extraordinary light rays are equal to each other, and it is confirmed that the condition therefor is $d = f_M$.

When the object image by the objective lens is formed at infinity, the extremity of $1/a \to o$ may be taken in the above-mentioned formula. However, this is on the premise that the principal points with respect to the ordinary light rays and extraordinary light rays in the double refraction element are substantially coincident with each other.

Also, if the spacing between the first object S1 and the second object S2 is $\Delta$, $\Delta$ is given by:

$$\Delta = f_M{}^2 (\phi e - \phi o).$$

Figure 2A:
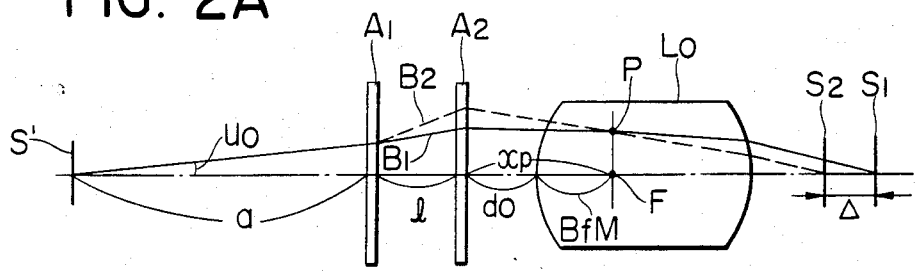
FIGS. 2A, 2B and 2C and 3 illustrate the fundamental construction of the present invention.

In contrast to such a construction, the fundamental construction according to the present invention in which a diverging element A1 and a converging element A2 are combined with an objective lens Lo is shown in FIG. 2A. In FIG. 2A, the images of a first object S1 and a second object S2 spaced apart from each other by $\Delta$ are formed on the same image plane S' at an equal magnification by the objective lens Lo, the diverging element A1 and the converging element A2. As shown, the diverging element A1 causes a second light ray B$_2$ to diverge relative to a first light ray B$_1$, and the converging element A2 spaced apart from the diverging element A1 by a distance l causes the second light ray B$_2$ to converge relative to the first light ray B$_1$. The rearward focus, namely, the image side focus F, of the objective lens Lo exists in the interior of the objective lens Lo and has a converging action equally for the first and second light rays.

Now, when the distance between the point of intersection P between the first light ray B$_1$ and the second light ray B$_2$ and the converging element A2 is X$_P$ and the spacing between the objective lens Lo and the converging element A2 is do and the back focal length of the objective lens Lo is Bf$_M$, the condition according to the present invention is expressed as
$$X_P = do + Bf_M.$$
Now, when the refractive powers of the diverging element A1 and the converging element A2 for the first light ray B$_1$, namely, the inverse numbers of the focal lengths, are $\phi$1o and $\phi$2o, respectively, and the refractive powers of the diverging element A1 and the converging element A2 for the second light ray B$_2$ are $\phi$1e and $\phi$2e, respectively, and $U_o = -1/a$ in the aforementioned light ray pursuit formula in the paraxial area, X$_p$ is $$X_P = \frac{Y_{2e} - Y_{2o}}{U_{2e} - U_{2o}}.$$

Accordingly, the condition according to the present invention is $$X_P = \frac{Y_{2e} - Y_{2o}}{U_{2e} - U_{2o}} = do + Bf_M. \tag{1}$$

Figure 2B:
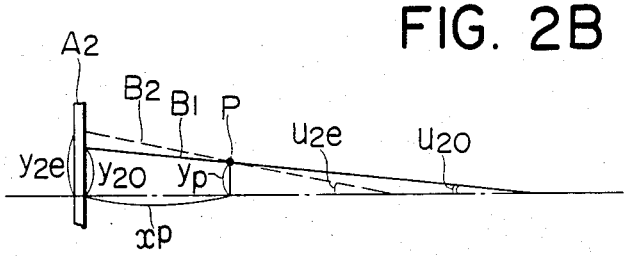

As shown in FIG. 2B, Y$_{2o}$ and Y$_{2e}$ are the heights of the first light ray B$_1$ and the second light ray B$_2$ emergent from the converging element A2, and U$_{2o}$ and U$_{2e}$ are the angles formed by the first light ray B$_1$ and the second light ray B$_2$ emergent from the converging element A2 with respect to the optical axis, and they are expressed as:

$$\left.\begin{array}{l}Y_{2o} = 1/a(a - al\phi 1o + l)\\ Y_{2e} = 1/a(a - al\phi 1e + l)\\ U_{2o} = 1/a\{a(\phi 1o - \phi 2o) + l\phi 2o(1 - a\phi 1o) - 1\}\\ U_{2e} = 1/a\{a(\phi 1e - \phi 2e) + l\phi 2e(1 - a\phi 1e) - 1\}\end{array}\right\} \tag{2}$$

Also, the distance Y$_P$ of the point of intersection P between the first light ray B1 and the second light ray B$_2$ from the optical axis is $$Y_p = -U_{2o}\frac{Y_{2e} - Y_{2o}}{U_{2e} - U_{2o}} + Y_{2o} \tag{3}$$

$$= \frac{Y_2 U_{2e} - U_{2o}Y_{2e}}{U_{2e} - U_{2o}}$$

Figure 2C:
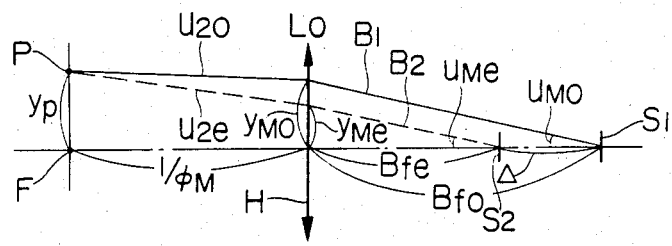

In such construction of the present invention, as shown in FIG. 2C, the point of intersection P between the first light ray B$_1$ and the second light ray B$_2$ lies at $1/\phi_M$ behind the principal plane H of the objective lens if the reflactive power of the objective lens Lo (namely, the inverse number of the focal length f$_M$ of the objective lens) is $\phi_M$. When the heights at which the first light ray B$_1$ and the second light ray B$_2$ cut the principal plane H of the objective lens are Y$_{Mo}$ and Y$_{Me}$, respectively, and the angles formed by the first light ray B$_1$ and the second light ray B$_2$ emergent from the objective lens L with respect to the optical axis are U$_{Mo}$ and U$_{Me}$, respectively, the following is given from the light ray pursuit formula:

$$U_{Mo} = U_{2o} + \phi_M\left(Y_P - \frac{U_{2o}}{\phi_M}\right) = \phi_M Y_P$$

$$U_{Me} = U_{2e} + \phi_M\left(Y_P - \frac{U_{2e}}{\phi_M}\right) = \phi_M Y_P$$

and thus, U$_{Mo}$=U$_{Me}$. Accordingly, it is apparent that the image magnification of the first object S1 by the first light ray B$_1$ is equal to the image magnification of the second object S2 by the second light ray B$_2$. Thus, the back focal lengths B$_{fo}$ and B$_{fe}$ of the composite system comprising the diverging element A1, the converging element A2 and the objective lens L with respect to the first light ray B$_1$ and the second light ray B$_2$ when reversely pursued from the image side are $$B_{fo} = \frac{Y_{Mo}}{U_{Mo}} = \frac{Y_P - U_{2o}/\phi_M}{\phi_M Y_P}$$

$$B_{fe} = \frac{Y_{Me}}{U_{Me}} = \frac{Y_P - U_{2e}/\phi_M}{\phi_M Y_P}$$

and the spacing $\Delta$ between the first object S1 and the second object S2 is expressed as $$\Delta = B_{fo} - B_{fe} = \frac{U_{2e} - U_{2o}}{Y_P} \cdot f_M{}^2$$

and by substituting equation (3) into this, the following is given:

$$\Delta = \frac{(U_{2e} - U_{2o})^2}{Y_{2o}U_{2e} - Y_{2e}U_{2o}} \cdot f_M{}^2. \tag{4}$$

Accordingly, the aforementioned equations (1), (2) and (4) are the basic conditions of the present invention, and these equations mean that two independent relations exist relative to five independent variables $\phi$1o, $\phi$2o, $\phi$1e, $\phi$2e and l. That is, if the spacing $\Delta$ between the first object S1 and the second object S2 and the focal length $f_M$ of the objective lens Lo are determined, the images of the first and second objects can be formed on the same image plane at an equal magnification by combining the diverging element A1 and the converging element A2 with the objective lens Lo while separating these two elements A1 and A2 from each other by a distance l so as to satisfy the above equation.

Figure 3:
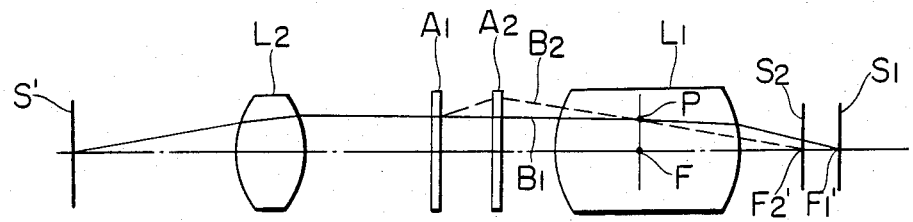

By so combining the diverging element and the converging element with any objective lens, the images of two objects separate from each other can be formed on the same plane at an equal magnification. The objective lens is not restricted to the finite type one shown in FIG. 2, but may also be an infinite type objective lens as shown in FIG. 3. In this case, in the composite system comprising the diverging element A1, the converging element A2 and the objective lens L1, the first object S1 lies at the focus position F1' with respect to the first light ray $B_1$, the second object S2 lies at the focus position F2' with respect to the second light ray $B_2$ and the images of the two objects are both formed at infinity. The images of the two objects are overlappingly formed by an imaging lens L2 on the rearward focal plane thereof. The imaging magnifications of the two objects at this time are determined by the ratio of the focal length of the imaging lens L2 to the focal length of the objective lens L1 and are of the same value.

The diverging element or the converging element used in the present invention is formed by combining elements having different refracting actions for two different light rays. Therefore, for example, a double refraction phenomenon having different refractive powers for two linearly polarized lights whose directions of polarization are orthogonal to each other or a dispersion phenomenon having different refractive powers for different wavelengths is applied.

Figure 4A:
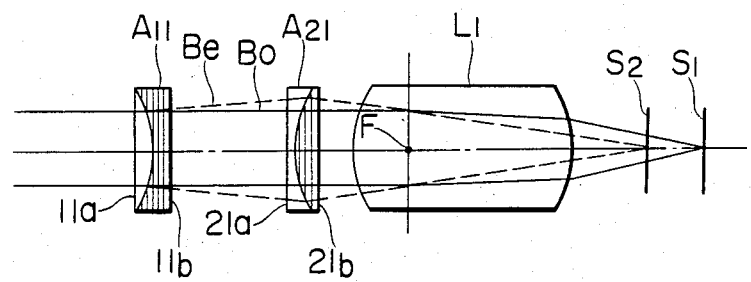
FIGS. 4A and 4B, 5A and 5B and 6 schematically show the constructions of embodiments of the present invention.

FIGS. 4A and B schematically show the constructions of embodiments in which the diverging element and the converging element are comprised of double refraction elements using quartz. In the construction of FIG. 4A, the diverging element A11 comprises a plano-convex lens 11a formed of optical glass and a plano-concave lens 11b formed of quartz, the lenses 11a and 11b being cemented together. Since the refractive index no of the plano-concave lens 11b of quartz for ordinary light rays is equal to the refractive index n of glass, this lens 11b acts as a mere parallel flat plate for the ordinary light ray Bo, but since the refractive index ne of the plano-concave lens 11b of quartz for extraordinary light rays is greater than the refractive index n of glass, this lens 11b causes the extraordinary light ray Be to diverge. The converging element A21 comprises a plano-concave lens 21a formed of optical glass and a plano-convex lens 21b formed of quartz, the lenses 21a and 21b being cemented together. In the converging element A21, as in the diverging element A11, ne>no=n and therefore, the converging element A21 acts as a mere parallel flat plate for the ordinary light ray Bo and converges the extraordinary light ray Be. In each lens formed of quartz, the optical axis of the quartz is perpendicular to the optical axis of the lens, and the optical axis of the two elements are parallel to each other. The point of intersection between the two light rays in the composite system comprising the two elements is coincident with the rearward focus F of the objective lens L1 due to the conditions of the aforementioned equations (1), (2) and (4), and the image of the first object S1 is formed at infinity by the ordinary light ray Bo and the image of the second object S2 is formed at infinity by the extraordinary light ray Be. The point of intersection between the ordinary light ray Bo and the extraordinary light ray Be in the composite system comprising the diverging element A11 and the converging element A21, that is, in this case, the principal point for the extraordinary light ray Be in the composite system, is coincident with the rearward focus F of the objective lens L1, and the composite focal length of the two elements A11, A21 and the objective lens L1 for the extraordinary light ray Be is equal to the focal length of the objective lens L1, and the image magnifications of the first and second objects are equal to each other.

Figure 4B:
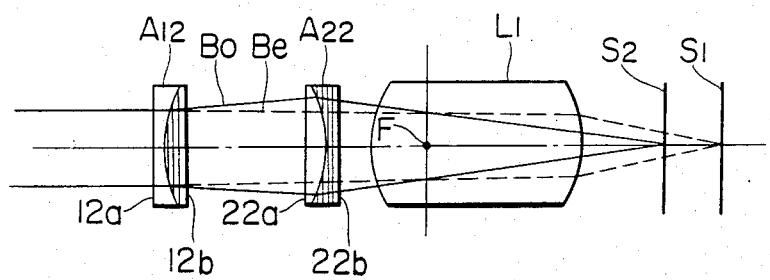

In the construction shown in FIG. 4A, the diverging element A11 and the converging element A21 are formed by the use of optical glass having a refractive index equal to the refractive index no of the lens of quartz for ordinary light rays, while in the construction shown in FIG. 4B, the diverging element A12 and the converging element A22 are formed by the use of optical glass having a refractive index equal to the refractive index ne of the lens of quartz for extraordinary light rays. That is, the diverging element A12 comprising a plano-concave lens 12a of glass and a plano-convex lens 12b of quartz cemented together acts as a mere parallel flat plate for the extraordinary light ray Be and causes the ordinary light ray Bo to diverge. The converging element A22 comprising a plano-convex lens 22a of glass and a plano-concave lens 22b of quartz cemented together acts as a mere parallel flat plate for the extraordinary light ray Be and converges the ordinary light ray Bo. The point of intersection between the ordinary light ray Bo and the extraordinary light ray Be in the composite system comprising the two elements, that is, in this case, the principal point for the ordinary light ray Bo in the composite system, is coincident with the rearward principal point of the objective lens L1. Therefore, the composite focal length of the two elements A21, A22 and the objective lens L1 for the ordinary light ray is equal to the focal length of the objective lens L1, and the image of the first object S1 by the extraordinary light ray Be and the image of the second object S2 by the ordinary light ray Bo are both formed at infinity at the same magnification.

Figure 5A:
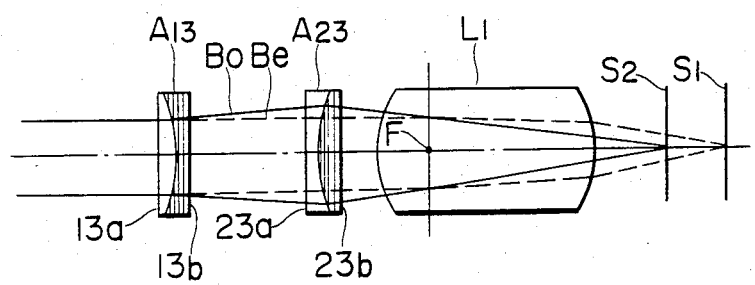
Figure 5B:
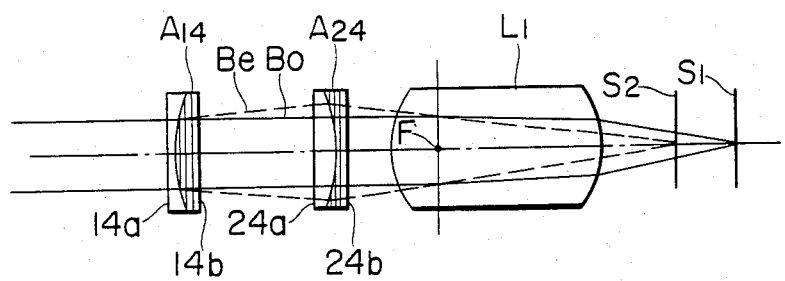

As described above, in quartz, the refractive index no for ordinary light rays is smaller than the refractive index ne for extraordinary light rays, whereas in calcite, the refractive index ne for extraordinary light rays is smaller than the refractive index no for ordinary light rays and calcite is a double refraction element having the relation that no >ne. FIGS. 5A and B schematically show the constructions of embodiments of the present invention using calcite. In the construction of FIG. 5A, a diverging element A13 comprises a plano-convex lens 13a of glass and a plano-concave lens 13b of calcite cemented together, a converging element A23 comprises a plano-concave lens 23a of glass and a plano-convex lens 23b of calcite cemented together, the refractive index of glass is equal to the refractive index of calcite for the extraordinary light ray Be, and the principal point of the composite system comprising the two elements A13 and A23 for the ordinary light ray Bo is coincident with the rearward principal point F of the objective lens L1. On the other hand, in the construction of FIG. 5B, a diverging element A14 comprises a plano-concave lens 14a of glass and a plano-convex lens 14b of calcite cemented together, a converging element A24 comprises a plano-convex lens 24a of glass and a plano-concave lens 24b of calcite cemented together, the refractive index of glass is equal to the refractive index of calcite for the ordinary light ray Bo, and the point of intersection between the two light rays in the composite system comprising the two elements A14 and A24, that is, in this case, the principal point of the composite system for the extraordinary light ray Be, is coincident with the rearward principal point F of the objective lens L1. Accordingly, even if calcite is used as the two double refraction elements, as in the case where quartz is used, the images of the first and second objects S1 and S2 spaced apart from each other can be formed at the same position at the same magnification. The construction of FIG. 5A is substantially equal to a condition in which the ordinary light ray Bo has changed places with the extraordinary light ray Be in the construction of FIG. 4A, and the construction of FIG. 5B is substantially equal to a condition in which the ordinary light ray Bo has changed places with the extraordinary light ray Be in the construction of FIG. 4B.

Figure 6:
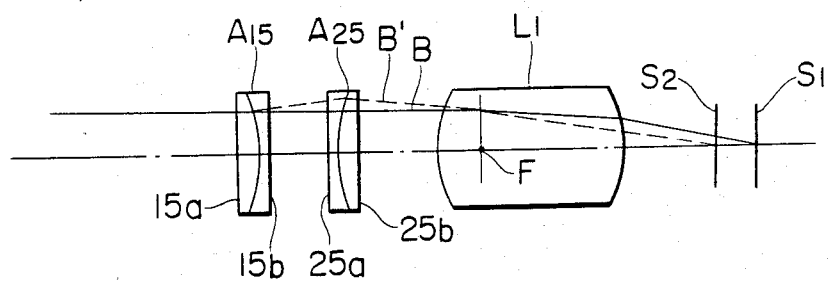

FIG. 6 shows an embodiment in which each of the diverging element and the converging element according to the present invention are comprised of a plano-convex lens and a plano-concave lens of glasses of different dispersions cemented together. In the construction of FIG. 6, the diverging element A15 is formed of a plano-convex lens 15a and a plano-concave lens 15b formed of glasses having equal refractive indices n for a reference wavelength light B and cemented together, and the plano-concave lens 15b is greater in the refractive index n' for a light B' of shorter wavelength than the reference wavelength light. Therefore, the diverging element A15 acts as a parallel flat plate for the reference wavelength light B and causes the short wavelength light B' to diverge. The converging element A25 is comprised of a plano-concave lens 25a and a plano-convex lens 25b formed of glasses having equal refractive indices n for the reference wavelength light B and cemented together, and the plano-convex lens 25b is greater in the refractive index n' for the short wavelength light B'. Therefore, the converging element A25 acts as a parallel flat plate for the reference wavelength light B and converges the short wavelength light B'. The point of intersection between the reference wavelength light B and the short wavelength light B' in the composite system comprising the diverging element A15 and the converging element A25, that is, in this case, the principal point of the composite system with respect to the short wavelength light B', is coincident with the rearward focus F of an objective lens L1. Accordingly, if the chromatic aberration of the objective lens L1 is corrected, the focal length of the composite system comprising the two elements A15, A25 and the objective lens L1 for the short wavelength light is equal to the focal length of the objective lens L1. Therefore, the image of the first object S1 is formed at infinity by the reference wavelength light B, the image of the second object S2 is also formed at infinity by the short wavelength light B', and if the imaging lens L2 as shown in FIG. 3 is used, the images of the first and second objects S1 and S2 spaced apart from each other can be formed at the same position at the same magnification.

In any of the above-described embodiments, the objective lens has been shown as being of the infinity type, whereas this is not restrictive but a finite type objective lens may also be employed. The objective lens and the aforementioned two elements need not be completely separated from each other, but the two elements may be provided within the objective lens. To maintain the imaging performance of the dual focus optical system good, aberration correction of the objective lens and the two elements is of course effected.

According to the present invention, as described above, an element for causing the first and second light rays to diverge relative to each other and an element for converging the two light rays relative to each other are combined and the point of intersection between the two light rays in the composite system comprising the two elements can be positioned at any position and therefore, wherever in the objective lens the rearward focus of the objective lens lies, that focus can be made accurately coincident with the composite principal point of the two elements and, by the use of any objective lens, the images of two objects spaced apart from each other can be formed on the same plane at the same magnification. Accordingly, by such a dual focus optical system, the images of two objects lying at different positions can be formed on the same plane at the same magnification. Thus, by such a dual focus optical system, two objects lying at different positions can be measured highly accurately and, if such optical system is applied to a proximity type exposure apparatus, a mask and a wafer can be aligned accurately.

I claim:

1. A dual focus optical system for causing the images of two objects separate from each other on the optical axis to be formed on the same image plane at the same magnification, comprising:

a diverging element for causing a second light ray to diverge relative to a first light ray;

a converging element provided on the object side of said diverging element for converging said second light ray relative to said first light ray; and an objective lens provided on the object side of said two elements for converging both of said first light ray and said second light ray;

said objective lens being disposed so that the point of intersection between said first light ray and said second light ray in the composite system comprising said diverging element and said converging element is coincident with the focal plane of said objective lens which is adjacent to said converging element, and wherein when the spacing between said two objects is $\Delta$ and the distance between said image plane and said diverging element is a and the focal length of said objective lens is $f_m$ and the back focal length of said objective lens on said converging element side is $Bf_m$ and the distance between said objective lens and said converging element is do and the distance between said diverging element and said converging element is l, said optical system satisfies the following conditions:

$$\frac{Y_{2e} - Y_{2o}}{U_{2e} - U_{2o}} = do + Bf_M$$

$$Y_{2o} = 1/a(a - al\phi_{1o} + l)$$
$$Y_{2e} = 1/a(a - al\phi_{1e} + l)$$
$$U_{2o} = 1/a\{a(\phi_{1o} - \phi_{2o}) + l\phi_{2o}(1 - a\phi_{1o}) - 1\}$$
$$U_{2e} = 1/a\{a(\phi_{1e} - \phi_{2e}) + l\phi_{2e}(1 - a\phi_{1e}) - 1\}$$

$$\Delta = \frac{(U_{2e} - U_{2o})^2}{Y_{2o}U_{2e} - Y_{2e}U_{2o}} \cdot f_{M^2}$$

where $\phi_{1o}$ and $\phi_{2o}$ represent the refractive powers of said diverging element and said converging element for said first light ray, namely, the inverse numbers of the focal lengths thereof, $\phi_{1e}$ and $\phi_{2e}$ represent the refractive powers of said diverging element and said coverging element for said second light ray, $Y_{2o}$ and $Y_{2e}$ represent the heights of said first light ray and said second light ray, respectively, emergent from said converging element, and $U_{2o}$ and $U_{2e}$ represent the angles formed by said first light ray and said second light ray, respectively, emergent from said converging element with respect to the optical axis.

2. A dual focus optical system according to claim 1, wherein said diverging element and said converging element each have a double refraction member.

3. A dual focus optical system according to claim 2, wherein said diverging element comprises a plano-convex lens formed of optical glass and a plano-concave lens formed of a double refraction member, said two lenses being cemented together, and said converging element comprises a plano-concave lens formed of optical glass and a plano-convex lens formed of a double refraction member, said two lenses being cemented together.

4. A dual focus optical system according to claim 2, wherein said diverging element comprises a plano-concave lens formed of optical glass and a plano-convex lens formed of a double refraction member, said two lenses being cemented together, and said converging element comprises a plano-convex lens formed of optical glass and a plano-concave lens formed of a double refraction member, said two lenses being cemented together.

5. A dual focus optical system according to claim 1, wherein said diverging element and said converging element each comprise optical glasses of different dispersions cemented together.

6. A dual focus optical system according to claim 5, wherein said diverging element comprises a plano-convex lens and a plano-concave lens formed of optical glasses having equal refractive indices for said first light ray, said two lenses being cemented together, the refractive index of said plano-concave lens for said second light ray being greater than that of said plano-convex lens, and said converging element comprises a plano-concave lens and a plano-convex lens formed of optical glasses having equal refractive indices for said first light ray, said two lenses being cemented together, the refractive index of said plano-convex lens for said second light ray being greater than that of said plano-concave lens.

7. A dual focus optical system for causing the images of first and second objects separate from each other on the optical axis to be formed on the same image plane at the same magnification, comprising:

an objective lens having an image side focal Plane for converging a first light ray and a second light ray, said first light ray forming an image of said first object and said second light ray forming an image of said second object;

a diverging element provided between said image plane and said objective lens for causing the second light ray to diverge relative to the first light ray; and a converging element provided between said diverging element and said objective lens for causing the second light ray to converge relative to the first light ray, said converging element being spaced apart from said diverging element;

the optical characteristics and positions of said diverging element and said converging element causing said second light to intersect with said first light ray at the object side of said converging element at a position of intersection that is coincident with said image side focal plane of said objective lens.

8. A dual focus optical system according to claim 7, wherein said objective lens has the image side focal plane in the interior thereof.

9. A dual focus optical system according to claim 8, wherein said diverging element and said converging element are both composed of a lens of optical glass and a lens of birefringent material cemented to each other.

10. A dual focus optical system according to claim 7, wherein said diverging element comprises a plano-convex lens formed of optical glass and a plano-concave lens formed of double refraction material, and wherein said converging element comprises a plano-concave lens formed of optical glass and a plano-convex lens formed of double refraction material.

11. A dual focus optical system according to claim 7, wherein said diverging element comprises a plano-convex lens formed of double refraction material and a plano-concave lens formed of optical glass, and wherein said converging element comprises a plano-concave lens formed of double refraction material and a plano-convex lens formed of optical glass.

12. A dual focus optical system according to claim 7, wherein said diverging element comprises a plano-convex lens and a plano-concave lens formed of optical glass having equal refractive indices for said first light ray, the refractive of said plano-concave lens for said second light ray being greater than that of said plano-convex lens, and wherein said converging element comprises a plano-concave lens and a plano-convex lens formed of optical glass having equal refractive indices for said first light ray, the refractive index of the last-mentioned plano-convex lens for said second light ray being greater than that of the last-mentioned plano-concave lens.

* * * * *